(12) United States Patent
Lee et al.

(10) Patent No.: US 9,502,477 B2
(45) Date of Patent: Nov. 22, 2016

(54) DISPLAY APPARATUS HAVING COLOR SATURATION FILTER WITH LAYERS OF DIFFERENT REFRACTIVE INDEXES

(71) Applicant: Samsung Display Co., Ltd., Yongin, Gyeonggi-do (KR)

(72) Inventors: Byoung-Duk Lee, Yongin (KR); Sang-Hwan Cho, Yongin (KR); Yun-Ah Chung, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/265,038

(22) Filed: Apr. 29, 2014

(65) Prior Publication Data

US 2015/0021569 A1 Jan. 22, 2015

(30) Foreign Application Priority Data

Jul. 18, 2013 (KR) ........................ 10-2013-0084925

(51) Int. Cl.
*H01L 27/32* (2006.01)
*G02B 5/20* (2006.01)

(52) U.S. Cl.
CPC ............... *H01L 27/322* (2013.01); *G02B 5/20* (2013.01); *H01L 27/32* (2013.01); *H01L 27/3206* (2013.01); *H01L 27/3211* (2013.01)

(58) Field of Classification Search
CPC ........... H01L 27/3211; H01L 27/3206; H01L 27/322; H01L 27/32
See application file for complete search history.

(56) References Cited

U.S. PATENT DOCUMENTS

| | | |
|---|---|---|
| 2005/0243425 A1 | 11/2005 | Wheatley et al. |
| 2006/0220549 A1 | 10/2006 | Kim et al. |
| 2006/0290274 A1* | 12/2006 | Oota ............................. 313/506 |
| 2008/0253132 A1* | 10/2008 | Urabe et al. .................. 362/327 |
| 2010/0019664 A1* | 1/2010 | Mishima ............. H01L 51/5237 313/504 |
| 2011/0042697 A1* | 2/2011 | Lee ....................... H01L 27/322 257/89 |

FOREIGN PATENT DOCUMENTS

| | | |
|---|---|---|
| KR | 10-2005-0013893 A | 2/2005 |
| KR | 10-2006-0104377 A | 10/2006 |
| KR | 10-2010-0090497 A | 8/2010 |

* cited by examiner

*Primary Examiner* — Michael Jung
(74) *Attorney, Agent, or Firm* — Knobbe, Martens, Olson & Bear, LLP

(57) ABSTRACT

A display apparatus and a filter for improving color purity (color saturation filter) are disclosed. In one aspect, the display apparatus includes a substrate, a display device formed on the substrate and having a plurality of pixel areas that emit different colors of light, and a color saturation filter on the display device. The color saturation filter is formed with a substantially uniform thickness over the plurality of pixel areas and has a transmissivity such that a full width at half maximum at the central wavelength of blue light emitted from one of the pixel areas is about 100 nm or less.

5 Claims, 3 Drawing Sheets

DISPLAY APPARATUS HAVING COLOR SATURATION FILTER WITH LAYERS OF DIFFERENT REFRACTIVE INDEXES

CROSS-REFERENCE TO RELATED APPLICATIONS

This application claims the benefit of Korean Patent Application No. 10-2013-0084925, filed on Jul. 18, 2013, in the Korean Intellectual Property Office, the disclosure of which is incorporated herein in its entirety by reference.

BACKGROUND

1. Field

The described technology generally relates to a display apparatus.

2. Description of the Related Technology

Generally, a display apparatus displays a full-color image using three colors of light, i.e., red, green, and blue light. An organic light-emitting diode (OLED) display uses a light-emitting material that emits light of a different color for each pixel, wherein the light-emitting materials for green and red light are relatively stable. However, the light-emitting material for blue light typically has the problems of decreasing emission efficiency, a relatively short life span, and a poor color purity.

If the color purity of any of the three colors of light-emitting devices decreases, the display apparatus including the light-emitting devices may not accurately display a full-color image and can have a significantly low color gamut.

SUMMARY OF CERTAIN INVENTIVE ASPECTS

One inventive aspect is a display apparatus having a filter for improving the color purity of blue light.

Another aspect is a display apparatus including a substrate, a display device formed on the substrate and including a plurality of pixel areas that emit light of different colors, and a color purity improving filter on the display device, wherein the color purity improving filter is formed with a substantially uniform thickness on the plurality of pixel areas and has a transmissivity such that a full width at half maximum (FWHM) at the central wavelength of light corresponding to a first color is about 100 nm or less.

The color purity improving filter may include a first thin film in which a plurality of layers having different refractive indexes are stacked, a second thin film in which a plurality of layers having different refractive indexes are stacked, and a spacing layer interposed between the first thin film and the second thin film.

Each of the first thin film and the second thin film may have a structure in which a first layer having a low refractive index and a second layer having a high refractive index are alternately stacked.

The refractive index n1 of the first layer may satisfy the expression of about 1.1≤n1<about 1.6, and the refractive index n2 of the second layer may satisfy the expression of about 1.6≤n2<about 3.0.

The thickness T2 of the spacing layer may satisfy the expression of $n\lambda/2(0.8) \leq T2 \leq n\lambda/2(1.2)$, and the thickness T1 of each layer forming the first thin film and the second thin film may satisfy the expression of $m\lambda/8(0.8) \leq T1 \leq m\lambda/8(1.2)$, where λ denotes the central wavelength of the light corresponding to the first color, and n and m denote integers.

The first color of light may be blue light.

The different colors of light may include second and light colors of light, and the color purity improving filter may have a transmissivity of about 80% or greater for each of the second and third colors of light.

The second color of light may be green light, and the third color of light may be red light.

The display apparatus may further include an encapsulating layer having a first surface facing the substrate and a second surface that is opposite to the first surface, wherein the color purity improving filter is on the first surface.

Another aspect is a display apparatus including a display device formed on a substrate and having a plurality of pixel areas that emit different colors of light, and a color purity improving filter formed in the emission direction of the light, and including a first thin film formed by stacking a plurality of layers having different refractive indexes, a second thin film formed by stacking a plurality of layers having different refractive indexes, and a spacing layer interposed between the first thin film and the second thin film, wherein the color purity improving filter is formed with a substantially uniform thickness on the plurality of pixel areas.

The color purity improving filter may have a transmissivity such that a full width at half maximum (FWHM) at the central wavelength of a first color of light is about 100 nm or less.

The different colors of light may include second and third colors of light that are different from the first color of light, and the color purity improving filter may have a transmissivity of about 80% or greater for each of the second and third colors of light.

The first color of light may be blue light, the second color of light may be green light, and the third color of light may be red light.

Each of the first thin film and the second thin film may be formed by alternately stacking a first layer having a low refractive index and a second layer having a high refractive index.

The refractive index n1 of the first layer may satisfy the expression of about 1.1≤n1<about 1.6, and the refractive index n2 of the second layer may satisfy the expression of about 1.6≤n2<about 3.0.

The thickness T2 of the spacing layer may satisfy the expression of $n\lambda/2(0.8) \leq T2 \leq n\lambda/2(1.2)$, and the thickness T1 of each layer forming the first thin film and the second thin film may satisfy the expression of $m\lambda/8(0.8) \leq T1 \leq m\lambda/8(1.2)$, where λ denotes the central wavelength of the first color of light, and n and m denote integers.

Another aspect is a display apparatus including a substrate, a plurality of organic light-emitting diodes (OLEDs) formed on the substrate and including a first pixel area for a blue color, a second pixel area for a green color, and a third pixel area for a red color, an encapsulating layer having a first surface facing the OLEDs and a second surface that is opposite to the first surface, and a color purity improving filter formed on the first surface of the encapsulating layer, including a plurality of layers having different thicknesses and transmissivities, improving a color purity of the blue light emitted from the first pixel area, and formed with a substantially uniform thickness on the first to third pixel areas.

The color purity improving filter may have a transmissivity such that a full width at half maximum (FWHM) at the central wavelength of the light emitted from the first pixel area is about 100 nm or less.

The color purity improving filter may include a first thin film in which a layer having a high refractive index and a layer having a low refractive index are alternately stacked, a second thin film in which a layer having a high refractive index and a layer having a low refractive index are alternately stacked, and a spacing layer interposed between the first thin film and the second thin film.

The thickness T2 of the spacing layer may satisfy the expression of $n\lambda/2(0.8) \leq T2 \leq n\lambda/2(1.2)$, and the thickness T1 of each layer forming the first thin film and the second thin film may satisfy the expression of $m\lambda/8(0.8) \leq T1 \leq m\lambda/8(1.2)$, where $\lambda$ denotes the central wavelength of the blue light emitted from the first pixel area, and n and m denote integers.

The color purity improving filter may have a transmissivity of about 80% or greater for light emitted from each of the second and third pixel areas.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

Figure 1:
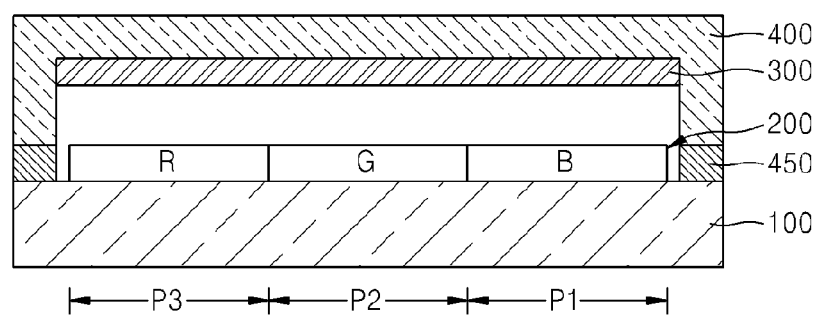
FIG. 1 is a cross-sectional view of a display apparatus according to an embodiment of the described technology.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the described technology. It will be understood that although the terms "first", "second", etc. may be used herein to describe various components, these components should not be limited by these terms. These components are only used to distinguish one component from another. The singular forms "a", "an", and "the" are intended to include the plural forms as well, unless the context clearly indicates otherwise. In the specification, it should be understood that terms, such as "include" and "have", are used to indicate the existence of an implemented feature, number, step, operation, element, part, or a combination thereof without excluding in advance the possibility of the existence or addition of one or more other features, numbers, steps, operations, elements, parts, or combinations thereof. The symbol "I" used herein may be analysed as "and" or "or" according to context.

Thicknesses of elements in the drawings may be exaggerated to clearly express several layers and pixel areas. Like reference numerals denote like elements throughout the specification. It will be understood that when a part, such as a layer, a film, a pixel area, or plate, is referred to as being "formed on" another part, it can be directly or indirectly formed on another part. That is, for example, intervening parts may be present.

As used herein, the term "and/or" includes any and all combinations of one or more of the associated listed items.

Figure 2:
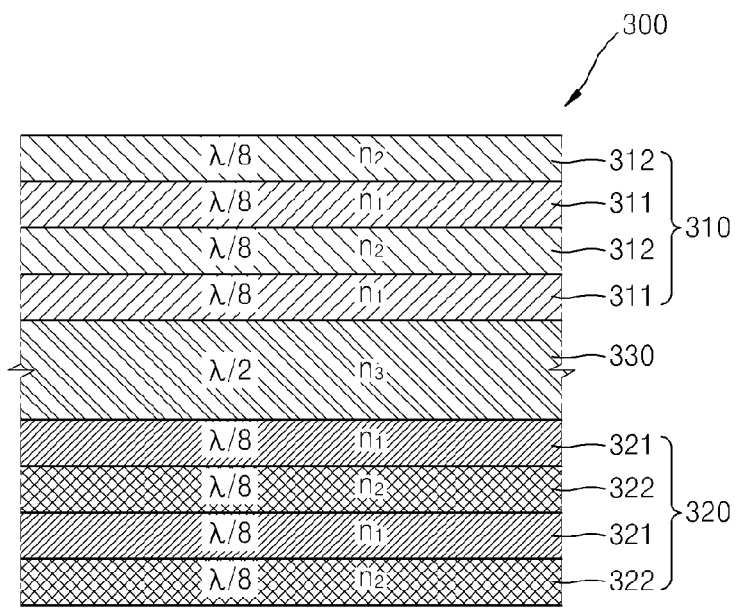
FIG. 2 is a cross-sectional view of a color purity improving filter in the display apparatus of FIG. 1.

FIG. 1 is a cross-sectional view of a display apparatus according to an embodiment of the described technology and FIG. 2 is a cross-sectional view of the color purity improving filter 300 in the display apparatus of FIG. 1. In FIG. 1, a first pixel area P1 for blue light, a second pixel area P2 for green light, and a third pixel area P3 for red light from among a plurality of pixel areas included in a display device 200 are shown for convenience of description.

Referring to FIG. 1, the display apparatus may include a substrate 100, a display device 200 formed on the substrate 100, a color purity improving filter (or a color saturation filter) 300 formed over the display device 200, and an encapsulating layer 400 that protects the display device 200 from foreign substances/the environment.

The substrate 100 may be formed of plastic having a high heat resistance and durability. However, the described technology is not limited thereto, and the substrate 100 may be formed of various materials, such as a metal, glass, or the like.

The display device 200 is formed on the substrate 100 and may include the first to third pixel areas P1, P2, and P3 that respectively emit light of different colors. According to an embodiment, the display device 200 may be an OLED display (or a plurality of OLEDs) where the first pixel area P1 emits blue light, the second pixel area P2 emits green light, and the third pixel area P3 emits red light.

The color purity improving filter 300 may be disposed over the display device 200 and light emitted by the display device 200 may pass therethrough. The color purity improving filter 300 may be formed on the whole surface of the display device 200 to cover all of the first to third pixel areas P1, P2, and P3.

The color purity improving filter 300 may have a first feature wherein a full width at half maximum (FWHM) at the central wavelength of blue light transmitted therethrough is about 100 nm or less in a transmissivity graph of the color purity improving filter 300. The color purity improving filter 300 may also have a second feature of having a transmissivity of about 80% or greater for green and red light, thereby transmitting the green and red light therethrough without significant loss of light while simultaneously improving the color purity of the blue light.

The encapsulating layer 400 protects the display device 200 from foreign substances and/or the environment and may be a glass substrate or an encapsulating thin film in which an organic layer and an inorganic layer are stacked.

According to some embodiments, the color purity improving filter 300 may be formed on one surface of the encapsulating layer 400. The color purity improving filter 300 may be formed on a first surface of the encapsulating layer 400 that faces the substrate 100. For example, the color purity improving filter 300 can be formed below or covered by the encapsulating layer 400. After the color purity improving filter 300 is formed on the first surface of the encapsulating layer 400, the encapsulating layer 400 may be bonded with the substrate 100 by using an adhesive 450 so that a second surface of the encapsulating layer 400 that faces the first surface is exposed to the environment.

Although an embodiment has been described in connection with FIG. 1 wherein the encapsulating layer 400 is a glass substrate, the described technology is not limited thereto. According to some embodiments, the encapsulating layer 400 may be an encapsulating thin film in which an organic layer and an inorganic layer are alternately stacked. In this case, the color purity improving filter 300 and the encapsulating thin film may be sequentially formed on the display device 200.

As described above, the color purity improving filter 300 is formed on the whole surface of the display device 200 regardless of the colors of light that are emitted from the first to third pixel areas P1, P2, and P3. In this case, the color purity improving filter 300 is formed to have a substantially uniform thickness across each of the first to third pixel areas P1, P2, and P3.

In general, blue light emitted by the display device 200 has a lower color purity than green and red light emitted by the display device 200. As a method for solving this problem, a blue light transmissive filter which only allows the transmission of blue light may be disposed on the first pixel area P1. However, in this case, to improve the color purity of the blue light without decreasing the emission efficiency and/or the color purity for the green and red light, the blue light transmissive filter is typically only formed on the first pixel area P1 for the blue color, and another type of filter that is different from the blue light transmissive filter is generally formed on each of the second pixel area P2 for the green color and the third pixel area P3 for the red color. In general, since pixel areas have a very small size, manufacturing a different filter for each pixel area significantly increases the associated costs and processing, and manufacturing errors may be difficult to prevent, and thus, it is difficult to improve color purity.

However, since the color purity improving filter 300 according to at least one embodiment may transmit green and red light without loss, may improve the color purity of the blue light, and may be formed with a substantially uniform thickness across all of the first to third pixel areas P1, P2, and P3, the manufacturing costs and the number of processes required may be dramatically reduced.

The color purity improving filter 300 may be formed with a plurality of layers having different refractive indexes. Referring to FIG. 2, the color purity improving filter 300 may include a first thin film 310 in which a plurality of layers having different refractive indexes are stacked, a second thin film 320 in which a plurality of layers having different refractive indexes are stacked, and a spacing layer 330 interposed between the first thin film 310 and the second thin film 320.

The first thin film 310 has a structure in which a first layer 311 having a low refractive index and a second layer 312 having a high refractive index are alternately stacked. Likewise, the second thin film 320 also has a structure in which a first layer 321 having a low refractive index and a second layer 322 having a high refractive index are alternately stacked. The spacing layer 330 is interposed between the first thin film 310 and the second thin film 320 and includes a layer having a relatively high refractive index. For example, a refractive index n1 of each of the first layers 311 and 321 may satisfy the expression of about $1.1 \leq n1 <$ about 1.6, a refractive index n2 of each of the second layers 312 and 322 may satisfy the expression of about $1.6 \leq n2 <$ about 3.0, and a refractive index n3 of the spacing layer 330 may satisfy the expression of about $1.6 \leq n3 <$ about 3.0.

According to an embodiment, each of the first thin film 310 and the second thin film 320 may be formed by alternately stacking a silicon oxide ($SiO_2$) layer having a low refractive index and an aluminum oxide ($Al_2O_3$) layer having a high refractive index, and the spacing layer 330 may be formed by stacking a silicon nitride ($SiN_x$) layer at least once.

In some embodiments, the thickness of the spacing layer 330 is greater than that of each of the first layers 311 and 321 and the second layers 312 and 322. For example, each of the first layers 311 and 321 and the second layers 312 and 322 may have a thickness T1 which satisfies the expression of $m\lambda/8(0.8) \leq T1 \leq m\lambda/8(1.2)$, and the spacing layer 330 may have a thickness of T2 which satisfies the expression of $n\lambda/2(0.8) \leq T2 \leq n\lambda/2(1.2)$, where $\lambda$ is the central wavelength of the blue light, and n and m are integers. In the current embodiment, the central wavelength $\lambda$ of the blue light is about 460 nm.

Although it is shown in FIG. 2 that the layers contacting the spacing layer 330 from among a plurality of layers forming the first thin film 310 and the second thin film 320 are the first layers 311 and 321, the described technology is not limited thereto. According to some embodiments, the layers contacting the spacing layer 330 may be the second layers 312 and 322 having a high refractive index.

Figure 3:
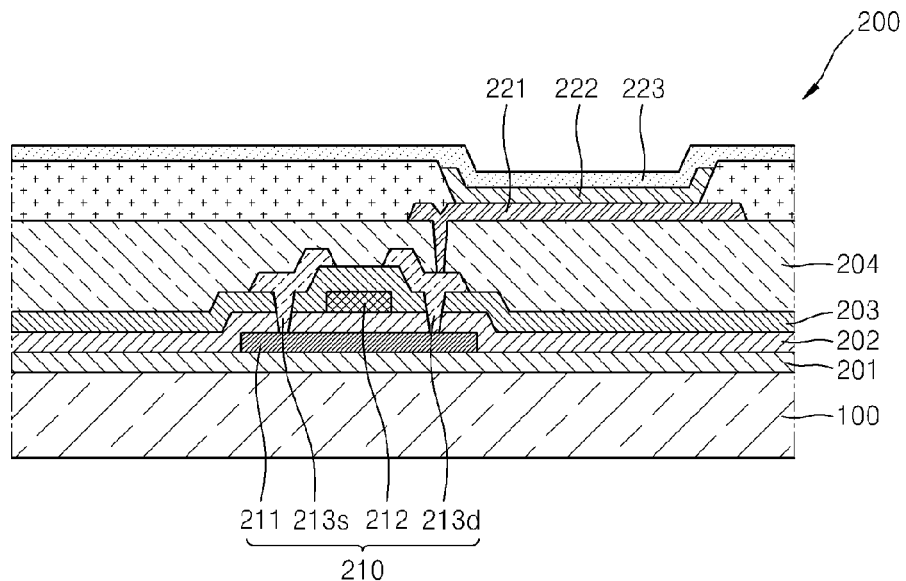
FIG. 3 is a cross-sectional view of one pixel area of a display device in the display apparatus of FIG. 1.
Figure 4:
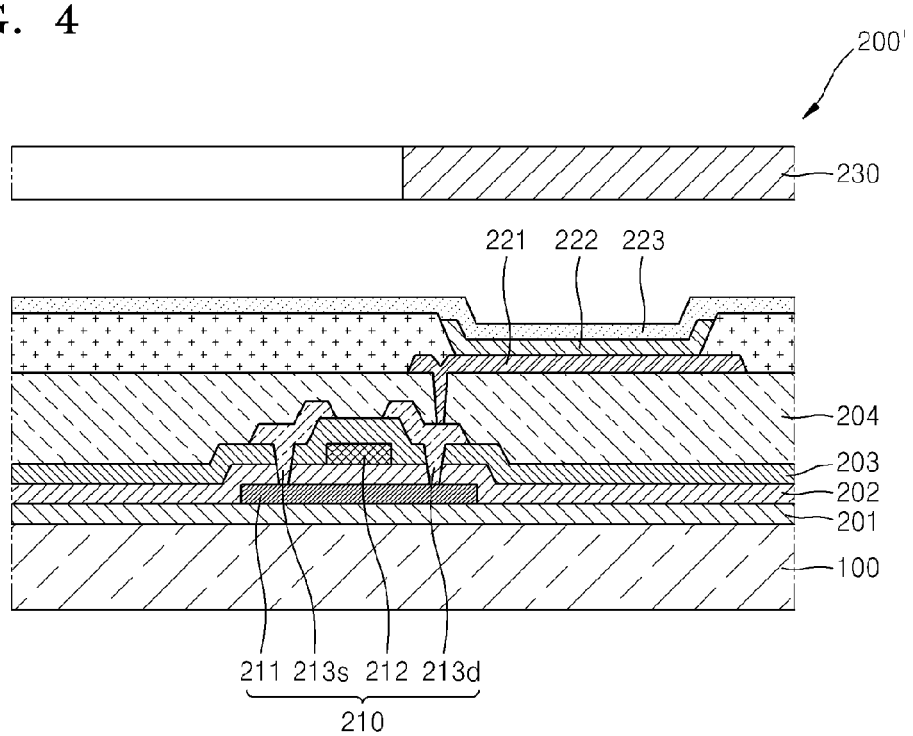
FIG. 4 is a cross-sectional view of one pixel area of a display device in the display apparatus of FIG. 1.

FIG. 3 is a cross-sectional view of one pixel area of the display device 200 in the display apparatus of FIG. 1, according to an embodiment, and FIG. 4 is a cross-sectional view of one pixel area of a display device 200' in the display apparatus of FIG. 1, according to another embodiment. In FIGS. 3 and 4, the display device 200 or 200' is an OLED.

Referring to FIG. 3, the display device 200 may include a buffer layer 201 formed on the substrate 100 to block foreign substances/moisture, a thin film transistor 210 on the buffer layer 201, a first electrode 221 connected to the thin film transistor 210, a second electrode 223 facing the first electrode 221, and an intermediate layer 222 interposed between the first and second electrodes 221 and 223 and including an organic emission layer.

The thin film transistor 210 may include an active layer 211, a gate electrode 212, a source electrode 213s, and a drain electrode 213d. A first insulating layer 202 is interposed between the gate electrode 212 and the active layer 211 and functions as a gate insulating layer for electrically insulating the gate electrode 212 from the active layer 211. The active layer 211 may include a channel region formed in the center thereof and a source region and a drain region at both sides of the channel region. The active layer 211 may include amorphous silicon, crystalline silicon, or an oxide semiconductor.

The source region and the drain region formed at both sides of the channel region may be doped with high-density impurities by using the gate electrode 212 as a self-aligned mask. Although the thin film transistor 210 is illustrated as a top gate type in FIG. 3, the described technology is not limited thereto. According to some embodiments, a bottom gate type thin film transistor may be employed.

The source and drain electrodes 213s and 213d are provided on the gate electrode 212 with a second insulating layer 203 interposed therebetween. The source and drain electrodes 213s and 213d are electrically connected to the source and drain regions of the active layer 211, respectively. A third insulating layer 204 may be formed on the source and drain electrodes 213s and 213d.

Any one of the source and drain electrodes 213s and 213d may be electrically connected to the first electrode 221. The intermediate layer 222, including the organic emission layer, and the second electrode 223 may be formed on the first electrode 221.

The structure as shown in FIG. 3 is formed for one pixel area, and the organic emission layer included in the intermediate layer 222 of each pixel area includes an organic material that emits red, green, or blue light.

The organic material that emits red, green, or blue light may include a low- or high-molecular organic material. When the organic material includes a low-molecular organic material, the intermediate layer 222 may further include a hole transport layer and a hole injection layer, which are formed between the first electrode 221 and the low-molecular organic material. The intermediate layer 222 can further include an electron transport layer and an electron injection layer, which are formed between the second electrode 223 and the low-molecular organic material. Additionally, various other layers may be further included according to the design requirements. When the organic material is a high-molecular organic material, the intermediate layer 222 may further include a hole transport layer between the first electrode 221 and the high-molecular organic material.

Referring to FIG. 4, the display device 200' according to another embodiment is similar to the display device 200 described with reference to FIG. 3 in that the display device 200' may include the thin film transistor 210 formed on the substrate 100, the first electrode 221 connected to the thin film transistor 210, the second electrode 223 facing the first electrode 221, and the intermediate layer 222 including an organic emission layer interposed between the first and second electrodes 221 and 223.

However, the display device 200' differs from the display device 200 in that the organic emission layer emits white light, and a color filter 230 is further included over the second electrode 223.

According to the display device 200 of FIG. 3, the organic emission layer included in each pixel area includes an organic material that emits a different color of light, such as blue, green, or red, for each pixel area, thereby emitting different colors of light. However, according to the display device 200' of FIG. 4, blue, green, or red light may be emitted by transmitting the white light emitted by the organic emission layer included in each pixel area through a color filter 230. In this case, a different color filter 230 is formed for each pixel area. For example, a blue color filter may be provided in a pixel area for emitting blue light, a green color filter may be provided in a pixel area for emitting green light, and a red color filter may be provided in a pixel area for emitting red light.

Although the display devices 200 and 200' are OLED display devices using an organic emission layer as described with reference to FIGS. 3 and 4, the described technology is not limited thereto. For example, the color purity improving filter 300 according to embodiments of the described technology may be used in liquid crystal display (LCD) displays.

Figure 5:
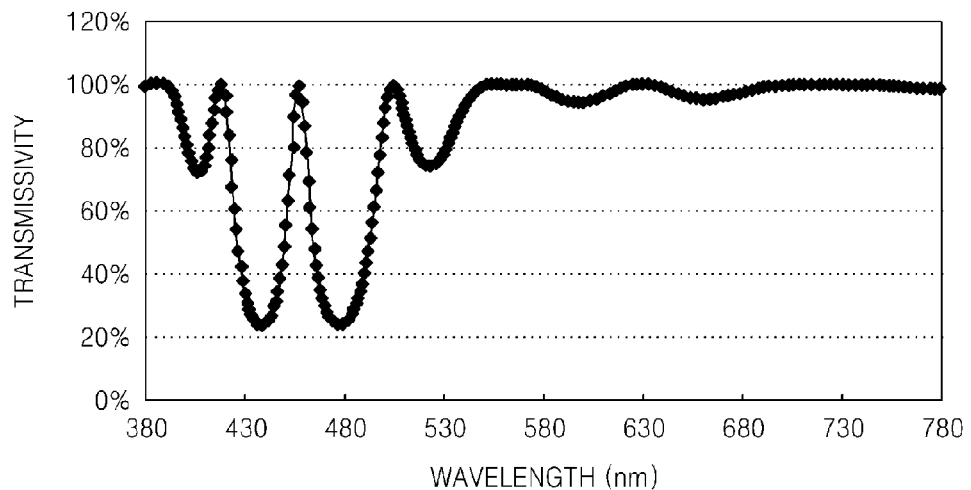
FIG. 5 is a graph showing the transmissivity characteristics of the color purity improving filter according to an embodiment.

FIG. 5 is a graph showing transmissivity characteristics of the color purity improving filter 300.

In the color purity improving filter 300 according to an embodiment, each of the first thin film 310 and the second thin film 320 is formed by alternately stacking the first layers 311 and 321 having a thickness of about 78 nm and including $SiO_2$ and the second layers 312 and 322 having a thickness of about 68 nm and including $Al_2O_3$, and the spacing layer 330 is formed by layering $SiN_x$ about six times so that the thickness of the spacing layer 330 is about 816 nm.

Referring to FIG. 5, for the color purity improving filter 300, the FWHM is about 12 nm based on the central wavelength of about 460 nm for blue light. As such, the color purity of the blue light may be improved by using the color purity improving filter 300 having a characteristic of a narrow transmissive filter with about 460 nm as the center wavelength.

The transmissivity of green light is about 80% or greater based on the central wavelength of green light of about 530 nm, and the transmissivity of red light is about 80% or greater based on the central wavelength of red light of about 620 nm.

According to some embodiments, the color purity improving filter 300 may improve the range of color reproduction of a display apparatus by improving the color purity of blue light while sufficiently passing green light and red light therethrough.

Figure 6:
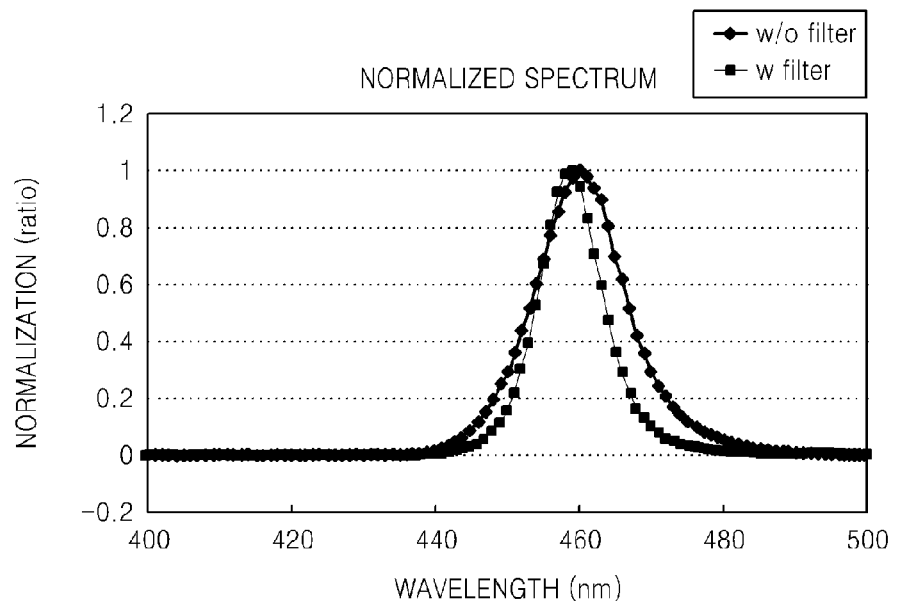
FIG. 6 is a graph showing spectra of blue light emitted from first pixel areas of display apparatuses according to an embodiment and a comparative example.

FIG. 6 is a graph showing spectra of blue light emitted from first pixel areas of display apparatuses according to an embodiment and a comparative example.

The display apparatus according to an embodiment includes the color purity improving filter 300, and the display apparatus according to the comparative example does not include the color purity improving filter 300. FIG. 6 illustrates the normalized spectra of the embodiment and the comparative example with a central wavelength (about 460 nm) to compare the embodiment and the comparative example with each other. In FIG. 6, "w filter" denotes the embodiment of the described technology, and "w/o filter" denotes the comparative example.

Referring to FIG. 6, the FWHM is about 14 nm at the central wavelength (about 460 nm) when the color purity improving filter 300 is not used, whereas the FWHM at the central wavelength (about 460 nm) is reduced to about 9 nm when the color purity improving filter 300 is used. That is, a color purity of blue light is improved when the color purity improving filter 300 is used.

For color coordinates, the color coordinates are improved when the color purity improving filter 300 is used, such that the color coordinates are about (0.145, 0.028) in the current embodiment, whereas the color coordinates are about (0.143, 0.034) in the comparative example.

As described above, according to at least one embodiment, a color purity improving filter capable of transmitting red and green light without significant loss while improving the color purity of blue light and a high-quality display apparatus having the same may be provided. Accordingly, a display apparatus having an improved range of color reproduction may be provided.

Since the color purity improving filter is formed with a substantially uniform thickness regardless of the color area the color purity improving filter is disposed over, the manufacturing process thereof may be simplified, and the manufacturing efficiency thereof may be improved.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the described technology have been described with reference to the figures, it will be understood by those of ordinary skill in the art that various changes in form and details may be made therein without departing from the spirit and scope of the present invention as defined by the following claims.

What is claimed is:
1. A display apparatus, comprising:
 a display device formed over a substrate and having a plurality of pixel areas configured to emit different colors of light; and a color saturation filter formed over the pixel areas and including i) a first thin film, ii) a second thin film, and iii) a spacing layer interposed between the first and second thin films, wherein each of the first and second thin films is formed of a plurality of stacked layers having different refractive indexes, wherein the color saturation filter has a substantially uniform thickness over the pixel areas, wherein the different colors of light include a first color of light, wherein the thickness T2 of the spacing layer satisfies the expression of $n\lambda/2(0.8) \leq T2 \leq n\lambda/2(1.2)$, and wherein the thickness T1 of each layer forming the first and second thin films satisfies the expression of $m\lambda/8(0.8) \leq T1 \leq m\lambda/8(1.2)$, where $\lambda$ is the central wavelength of the first color of light and n and m are integers.

2. The display apparatus of claim 1, wherein the different colors of light include first, second and third colors of light, and wherein the color saturation filter has a transmissivity of 80% or greater for each of the second and third colors of light.

3. The display apparatus of claim 2, wherein the first, second, and third colors of light are blue, green and red light, respectively.

4. The display apparatus of claim 1, wherein the layers of each of the first and second thin films include first and second layers which are alternately formed, wherein the first layer has a lower refractive index than the second layer.

5. The display apparatus of claim 4, wherein the refractive index n1 of the first layer satisfies the expression of $1.1 \leq n1 < 1.6$ and wherein the refractive index n2 of the second layer satisfies the expression of $1.6 \leq n2 < 3.0$.

* * * * *